United States Patent [19]
Yeung

[11] Patent Number: 5,701,098
[45] Date of Patent: Dec. 23, 1997

[54] AC BYPASS CIRCUIT WHICH PROVIDES STABILIZATION OF HIGH FREQUENCY TRANSIENT NOISE

[75] Inventor: Pak-Ho Yeung, San Jose, Calif.

[73] Assignee: National Semiconductor Corporation, Santa Clara, Calif.

[21] Appl. No.: 576,739

[22] Filed: Dec. 21, 1995

[51] Int. Cl.$^6$ ............................................. H03K 17/16
[52] U.S. Cl. .................. 327/538; 327/531; 327/532; 327/384; 327/310; 327/558; 326/33
[58] Field of Search .......................... 327/309, 310, 327/311, 312, 379, 384, 528, 538, 558, 551, 552; 326/33, 101; 361/111, 56

[56] References Cited

U.S. PATENT DOCUMENTS

| | | | |
|---|---|---|---|
| 3,911,296 | 10/1975 | Davis | 307/297 |
| 4,709,159 | 11/1987 | Pace | 307/227 |
| 4,894,567 | 1/1990 | Lenk | 327/384 |
| 5,049,764 | 9/1991 | Meyer | 307/433 |
| 5,179,362 | 1/1993 | Okochi et al. | 333/181 |
| 5,327,027 | 7/1994 | Taylor | 307/490 |
| 5,379,003 | 1/1995 | Bizen | 331/117 |

OTHER PUBLICATIONS

"Linear Technology", High Speed Amplifier Techniques, Jim Williams, Aug. 1991, Application Note No. 47, pp. AN47–1–4, An4711–12.

"Feedback Eliminates Switch Contact Transients", Veikko O. Jaakola, The Electronic Engineer, Jan. 1971, vol. 30, No. #1.

*Primary Examiner*—Timothy P. Callahan
*Assistant Examiner*—Dinh T. Le
*Attorney, Agent, or Firm*—Limbach & Limbach L.L.P.

[57] ABSTRACT

An integrated circuit includes a semiconductor die and electronic circuitry elements formed therein. First and second internal power supply lines transmit first and second supply voltages to provide power for the circuitry elements. The die includes bypass circuitry to inhibit variations in the supply voltages. The bypass circuitry includes transconductance circuitry, characterized by a variable conductivity, having a first flow electrode coupled to the first supply line, a second flow electrode coupled to the second supply line, and a control electrode for controlling current flow between the flow electrodes. The conductivity of the transconductance circuitry varies in response to a voltage difference between the control electrode and the second flow electrode. Voltage amplifier circuitry has a first input terminal coupled to the first supply line and a second input terminal coupled to the second supply line. The voltage amplifier circuitry amplifies a voltage difference between the first supply line and the second supply line. The amplified voltage difference is provided at an output terminal. Capacitive coupling circuitry couples the output terminal of the voltage amplifier circuitry to the control terminal of the transconductance circuitry. Feedback circuitry couples the first flow electrode of the transconductance circuitry to the input terminal of the voltage amplifier circuitry. Preferably, the transconductance circuitry has a high input impedance seen by the voltage amplifier circuitry, which reduces the capacitance value of the capacitative coupling required to pass an AC signal unattenuated from the output of the voltage amplifier circuitry to the control electrode of the transconductance circuitry.

3 Claims, 2 Drawing Sheets

AC BYPASS CIRCUIT WHICH PROVIDES STABILIZATION OF HIGH FREQUENCY TRANSIENT NOISE

FIELD OF THE INVENTION

The present invention relates to AC bypass circuit and, more specifically, to an AC bypass circuit which is especially configured for reducing power supply voltage fluctuations that occur internal to an integrated circuit.

BACKGROUND OF THE INVENTION

Many integrated circuits have parasitic inductances due, for example, to internal bond wires and packages. Parasitic inductances result from metal traces being in close proximity to each other, and these parasitic inductances interfere with high-speed operation of the circuits. External printed circuit board traces and interconnecting cables are a further source of interference. In particular, the high frequency voltage fluctuations that these parasitic inductances may cause on the power supply line to an integrated circuit can distort the outputs of portions of the integrated circuit, or even render portions of the integrated circuit inoperative. Conventionally, a large value bypass capacitor is connected external to the integrated circuit, between the external power and ground pins. The bypass capacitor shunts a signal between the power and ground pins with an impedance equal to $1/(2 \lambda Cf)$. If this impedance is low enough (i.e., the capacitance is high enough—a typical capacitance would be 1000 pf), then high frequency voltage fluctuations can be minimized. However, such external bypassing only reduces voltage fluctuations due to parasitic elements external to the integrated circuit. That is, the parasitic elements internal to the integrated circuit are not affected by an external bypass capacitor. Implementing an internal bypass capacitor, for reducing power supply voltage fluctuations internal to the integrated circuit, would be prohibitively expensive in terms of the die space required to implement a capacitor large enough to be effective.

U.S. Pat. No. 5,379,003 issued to Bizen on Jan. 3, 1995 discloses a discrete voltage controlled oscillator (VCO) and buffer circuit which employs a resistor/capacitor (RC) low pass filter on its supply line. Unfortunately, using such an RC filter to reduce power supply voltage fluctuations within an integrated circuit is not practical since the resistor of the RC circuit itself causes voltage fluctuations. U.S. Pat. No. 5,179,362 issued to Okochi et al. on Jan. 12, 1993 discloses the use of an inductor/capacitor (LC) filter on a power line output of a power supply source. However, inductors are not generally available in IC fabrication processes.

U.S. Pat. No. 5,049,764 issued to Meyer on Sep. 17, 1991 recognizes that an internal capacitor would employ a large amount of die area. Meyer addresses this problem by providing an "active feedback" circuit. For example, see Meyer's FIG. 6, which is reproduced in the present disclosure, in a simplified form, as FIG. 1. Referring now to FIG. 1, a transconductance (transistor QBP) is connected between VCC and GND. A sensing capacitor Cs is connected between VCC and the base of transistor QBP. Current source Is (consisting of resistors R1–R3 and transistor QA) biases transistor QBP to keep transistor QBP in conductive operation. The amount which transistor QBP conducts depends on the voltage difference between the collector and base of transistor QBP. When there are rapid changes in the supply voltage VCC relative to GND, the capacitor Cs senses these changes and feeds them back to the transistor QBP. Specifically, when VCC rises, capacitor Cs pulls the voltage at the base of transistor QBP upward to make transistor QBP more conductive. When VCC falls, capacitor Cs pulls the voltage of transistor QBP downward to make transistor QBP less conductive.

However, this circuit has a minimum bypass impedance of about 1/Gm (where Gm is the transconductance) if Cs is much larger than the parasitic capacitances of QBP and QA. U.S. Pat. No. 5,327,027 issued to Taylor on Jul. 5, 1994 discloses providing a feedback-connected amplifier in front of a transconductance to increase the effective transconductance. Using such an arrangement in the FIG. 1 circuit would lower the minimum bypass impedance by a factor equivalent to the voltage gain of the feedback amplifier. However, in order to incorporate a feedback amplifier into the FIG. 1 circuit, level translation circuitry must be provided to match the output of the amplifier to the input of the transconductor.

SUMMARY OF THE INVENTION

The present invention provides an integrated circuit that includes a semiconductor die. A group of electronic circuitry elements is formed in the semiconductor die. An electrical interconnection system, formed in the semiconductor die, includes first and second internal power supply lines for transmitting first and second supply voltages to provide power for the circuitry elements.

The die includes bypass circuitry configured to inhibit variations in the supply voltages. The bypass circuitry includes transconductance circuitry, characterized by a variable conductivity. The transconductance circuitry has a first flow electrode coupled to the first supply line, a second flow electrode coupled to the second supply line, and a control electrode for controlling current flow between the flow electrodes. The conductivity of the transconductance circuitry varies in response to a voltage difference between the control electrode and the second flow electrode.

Voltage amplifier circuitry of the bypass circuitry has a first input terminal coupled to the first supply line and a second input terminal coupled to the second supply line. The voltage amplifier circuitry amplifies a voltage difference between the first supply line and the second supply line. The amplified voltage difference is provided at an output terminal.

Capacitive coupling circuitry couples the output terminal of the voltage amplifier circuitry to the control terminal of the transconductance circuitry, and feedback circuitry couples the first flow electrode of the transconductance circuitry to the input terminal of the voltage amplifier circuitry.

Preferably, the transconductance circuitry has a high input impedance seen by the voltage amplifier circuitry, which reduces the capacitance value of the capacitative coupling required to pass AC signal unattenuated from the output of the voltage amplifier circuitry to the control electrode of the transconductance circuitry.

DETAILED DESCRIPTION OF THE INVENTION

Figure 1:
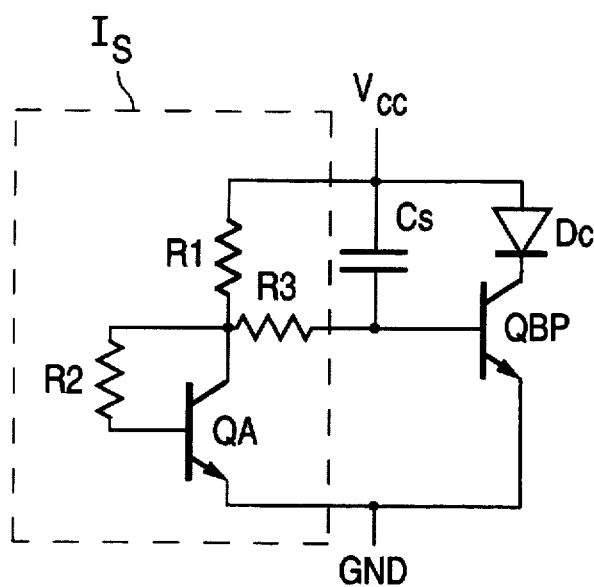
FIG. 1 is a circuit diagram of a conventional active feedback AC bypass circuit.
Figure 2:
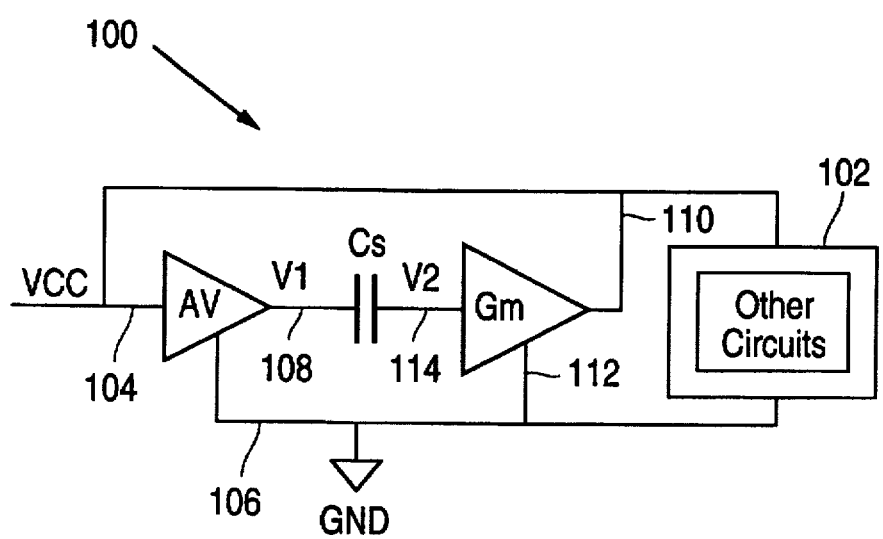
FIG. 2 is a circuit diagram of an active feedback AC bypass circuit in accordance with an embodiment of the present invention.

FIG. 2 is a block circuit diagram of a circuit 100 in accordance with an embodiment of the present invention in its broadest form. Block 102, labelled "Other Circuits", denotes the circuitry to which it is desired to provide power without high frequency voltage fluctuations. A voltage amplifier, AV, has a high input impedance and a low output impedance. A transconductor, Gm, has both a high input impedance and a high output impedance.

The voltage amplifier AV has one input 104 connected to the VCC power supply line and another input 106 connected to the GND power supply line. The voltage amplifier AV has an output 108 at which it provides a signal whose voltage (V1) represents an amplified difference between the voltages at the two inputs 104, 106.

The transconductor, Gm, has a variable conductivity. A first flow electrode 110 is connected to the VCC power supply line and a second flow electrode 112 is connected to the GND power supply line. A voltage difference between a control electrode 114 and the second flow electrode 112 controls the current flow between the first flow electrode 110 and the second flow electrode 112. That is, the conductivity of the transconductor (i.e., the magnitude of the current flow between the first flow electrode 110 and the second flow electrode 112) varies as a function of the difference between the voltage at the control electrode 114 and the first flow electrode 110.

Capacitive coupling circuitry Cs (which may include a single or plural capacitive elements) couples the output 108 of the voltage amplifier AV to the control electrode 114 of the transconductance Gm. Significantly, the transconductance Gm has a high input impedance, seen by the voltage amplifier AV. This reduces the capacitance value of the capacitor Cs required to pass an AC signal unattenuated from the output 108 of the voltage amplifier AV to the control electrode 114 of the transconductance Gm. Another significant feature of the circuit 100 is that the second flow electrode is fed back to the input 104 of the voltage amplifier AV.

Figure 3:
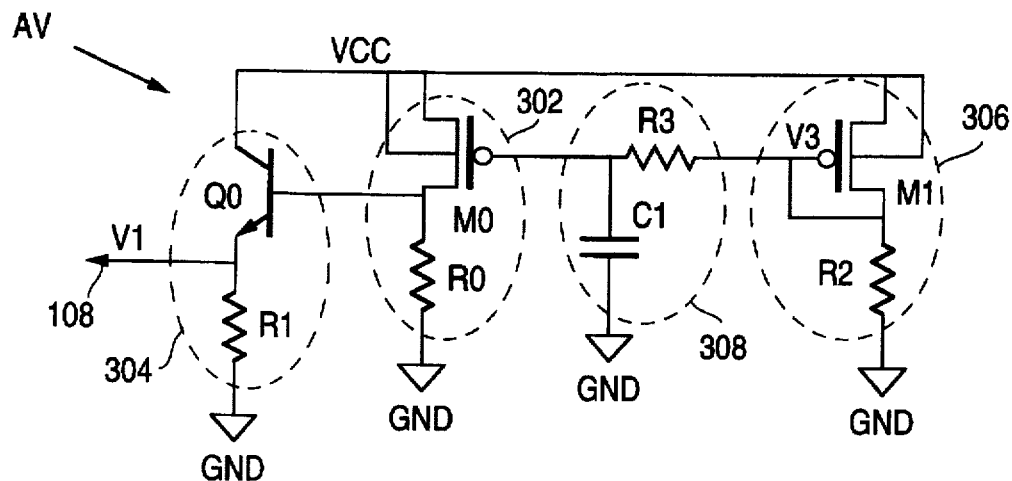
FIG. 3 is a circuit diagram of an embodiment of the voltage amplifier circuitry of the FIG. 2 circuit.

Referring now to FIG. 3, a particular embodiment of the voltage amplifier AV is shown. A common gate voltage amplifier stage 302 of the voltage amplifier AV consists of transistor M0 and resistor R0. An emitter follower 304, consisting of transistor Q0 and resistor R1, are provided for low impedance output to output terminal 108. The voltage amplifier stage 306 is biased with a current mirror 306, which consists of transistor M1 and resistor R2. As is discussed in more detail below, the "ratio" of the current mirror 306 to the voltage amplifier stage 302 determines the DC bias and voltage gain of the voltage amplifier AV. A low bass network 308, consisting of resistor R3 and capacitor C1 holds the gate of transistor M0 at a constant voltage with respect to GND, at and above the −3 dB frequency set by 1/(2λ*R3*C1). The −3 dB frequency should be chosen to be lower than the frequency at which other circuits are sensitive to supply voltage transients.

The DC bias and voltage gain of the voltage amplifier AV are:

$$DC \text{ Bias: } DC = (Vcc - Vgs1 - GND) \times \left(\frac{M0}{M1}\right) \times \left(\frac{R0}{R2}\right) - Vbe0 \quad (1)$$

and $$\text{Voltage Gain: } Av = 2 \times \left(\frac{Vcc - Vgs1 - GND}{Vgs1 - Vt}\right) \times \left(\frac{M0}{M1}\right) \times \left(\frac{R0}{R2}\right) \quad (2)$$

where the "standard" quadratic equation for a MOS transistor operating in the saturation region is assumed. (This "standard" quadratic equation is described, for example, in Richard S. Muller and Theodore I. Kamins, *Device Electronics for Integrated Circuits*, Wiley, N.Y. 1977, p. 354).

The Mx's in equation (1) and (2) are the W/L ratio of the MOS transistors; Vbe0 is the base-to-emitter voltage of the NPN transistor Q0; Vgs1 is the absolute value of the gate-to-source voltage of transistors M0 and M1; and Vt is the absolute value of the MOS transistor threshold voltage.

Preferably, the components of the voltage amplifier are chosen so that the voltage gain is as large as possible (according to equation (2)) without the DC bias (according to equation (1)) being so high that transistor M0 is operating in the triode region. Operation of transistor M0 in the triode regions occurs when:

$$DC \text{ Bias} \geq Vcc - Vgs1 \times Vt - Vbe0 \quad (3)$$

While other biasing circuits can be employed within the scope of the invention, the biasing circuit (i.e., resistor R3, capacitor C1, transistor M1, and resistor R2) shown in FIG. 3 provides a predictable voltage gain with a relatively simple circuit configuration.

Figure 4:
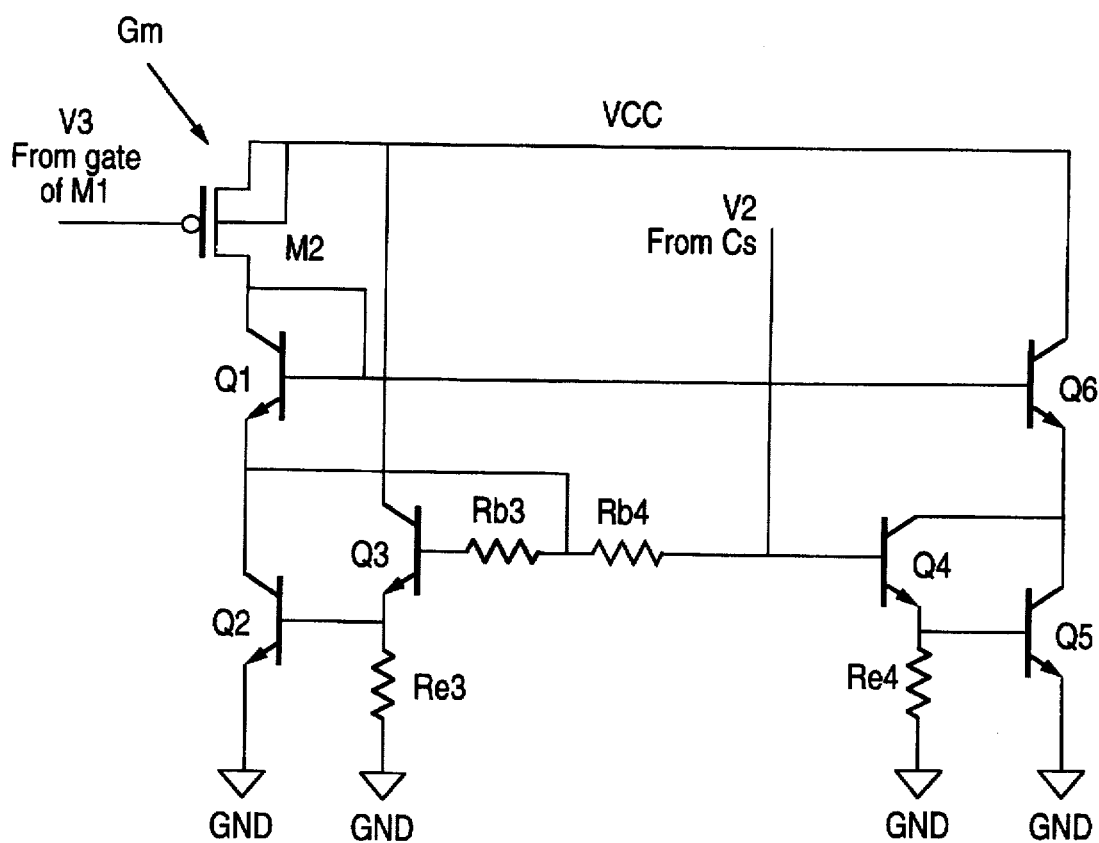
FIG. 4 is a circuit diagram of an embodiment of the transconductance circuitry of the FIG. 2 circuit.

Referring now to FIG. 4, a particular embodiment of the transconductor Gm is shown. NPN transistor Q5 provides a transconductor stage, which is buffered by a small emitter follower transistor Q4. Emitter follower transistor Q4 is biased with a current generated across resistor Re4. A cascode transistor Q6 reduces the collector-to-emitter voltage of NPN transistor Q5 in order to minimize the likelihood that transistor Q5 will break down. Emitter follower transistor Q4 increases the input impedance seen by the voltage amplifier AV, which reduces the value of Cs required for passing an AC signal unattenuated from the voltage amplifier AV to the transconductor Gm.

Transistors Q4–Q6 are biased with a current mirror consisting of transistors Q1–Q3, and the current mirror Q1–Q3 is biased with a current source that consists of P-channel MOS transistor M2. Transistors Q3 and Q4 are matched to each other, as are their base and emitter resistors, respectively. That is, resistor Rb3 is matched to resistor Rb4 and resistor Re3 is matched to resistor Re4 so that the biasing current provided to transistor Q3 matches the biasing current provided to transistor Q4 and, similarly, so that the voltage drop across transistor Q3 matches the voltage drop across transistor Q4. Thus, there is a precise biasing point at the bases of transistors Q5 and Q2.

On the other hand, transistor Q2 is scaled to transistor Q5 so that their currents are also scaled. Thus, a desirable bias current is provided to transistor Q5 without causing an excessive current in the biasing current mirror of transistor Q2. The bias current for transistor Q5 is $$IQ5 = IM2 \times \frac{Q5}{Q2} \quad (4)$$

where IM2 is the biasing current source in transistor M2 and Q5/Q2 is the device size ratio of transistor Q5 to transistor Q2. The bias current in transistor Q5 determines both the transconductance of transistor Q5 and, thus, the transconductance of transconductor Gm as:

$$Gm = q \times IQ5/kT \quad (5)$$

where the term kT/q is the well known thermal voltage of a PN junction.

The resistor Rb4 isolates the AC signal from transistors Q3 and Q2. Resistor Rb3 matches any DC voltage drop across Rb4 which is caused by base currents in transistors Q4 and Q3. The input impedance seen at the base of transistor Q4, where the coupling capacitor Cs is connected, is essentially Rb4. This results in an output current for the transconductor Gm of:

$$Iout = \frac{Rb4 \times Cs \times S}{1 + Rb4 \times Cs \times S} \times Gm \times V1 \qquad (6)$$

where Gm is the transconductance of transistor Q5 given by (5). High frequency and Q4 base current effects are ignored.

Referring again to FIG. 2, the operation of the circuit 100 is now explained. In response to an AC voltage transient on the VCC power supply line, the voltage amplifier AV amplifies the voltage transient with a voltage gain given by equation (2). This in turn causes an output current from the transconductor Gm which is given by equation (6). Substituting for V1 yields:

$$Iout = Av \times VCC \times \frac{Rb4 \times Cs \times S}{1 + Rb4 \times Cs \times S} \times Gm \qquad (7)$$

The impedance Zvcc seen by VCC is just the ratio of VCC to Iout, i.e., $$Zvcc = \frac{1 + Rb4 \times Cs \times S}{Rb4 \times Cs \times S} \times \frac{1}{Av \times Gm} \qquad (8)$$

Av is determined from equation (2), and Gm is determined from equations (4) and (5). Here, Zvcc initially decreases with frequency and reaches a minimum value where the frequency of the voltage fluctuation is 1/(Av×Gm) at the pole frequency 1/(Rb4×Cs). By providing a small Zvcc, the voltage on the VCC power supply line is held relatively stable. The zero Rb4Cs should be chosen low enough so that Zvcc reaches a minimum value in the frequency range where the other circuits are sensitive to voltage transients on the supply bus. With reference to equation (8), it can be seen that the voltage amplifier AV provides this desired reduction in Zvcc.

What is claimed is:

1. An integrated circuit, comprising:

electronic circuitry elements;

first and second, internal power supply lines for transmitting first and second supply voltages to provide power for the circuitry elements;

bypass circuitry including:

transconductance circuitry, characterized by a variable conductivity, the transconductance having a first flow electrode coupled to the first supply line, a second flow electrode coupled to the second supply line, and a control electrode for controlling current flow between the flow electrodes, the conductivity of the transconductance circuitry varying in response to a voltage difference between the control electrode and the second flow electrode;

voltage amplifier circuitry having a first input terminal coupled to the first supply line and a second input terminal coupled to the second supply line, the voltage amplifier circuitry amplifying a voltage difference between the first supply line and the second supply line, the voltage amplifier circuitry further having an output terminal at which the amplified voltage difference is provided; and capacitive coupling circuitry that couples the output terminal of the voltage amplifier circuitry to the control electrode of the transconductance circuitry, wherein the first flow electrode of the transconductance circuitry is coupled to the first input terminal of the voltage amplifier circuitry.

2. An integrated circuit as in claim 1, wherein the voltage amplifier circuitry includes:

voltage gain circuitry having a first input terminal coupled to the first supply line, a second input terminal coupled to the second supply line, a control terminal, and an output terminal, a value of a voltage the output terminal of the voltage gain circuitry being responsive to a voltage difference between the control terminal and the first input terminal;

output stage circuitry coupling the output terminal of the voltage gain circuitry to the output terminal of the voltage amplifier circuitry and presenting a low impedance thereto;

biasing circuitry having a first input terminal coupled to the first supply line, a second input terminal coupled to the second supply line, and providing a bias voltage at an output terminal; and low-pass circuitry coupling the output terminal of the biasing circuitry to the control terminal of the voltage gain circuitry.

3. An integrated circuit as in claim 2, wherein the low-pass circuitry passes a low frequency which is lower than a frequency at which the electronic circuitry elements are sensitive to supply voltage transients.

\* \* \* \* \*

UNITED STATES PATENT AND TRADEMARK OFFICE
CERTIFICATE OF CORRECTION

PATENT NO. : 5,701,098
DATED : December 23, 1997
INVENTOR(S) : PAK-HO YEUNG

It is certified that error appears in the above-identified patent and that said Letters Patent is hereby corrected as shown below:

In Col. 5, line 46, delete ",".

In Col. 6, line 29, after "voltage" insert --at--.

Signed and Sealed this

Twenty-fourth Day of March, 1998

Attest:

BRUCE LEHMAN

Attesting Officer

Commissioner of Patents and Trademarks